United States Patent
Juengling

(10) Patent No.: US 9,847,337 B1
(45) Date of Patent: Dec. 19, 2017

(54) MEMORY ARRAYS COMPRISING FERROELECTRIC CAPACITORS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/391,699

(22) Filed: Dec. 27, 2016

(51) Int. Cl.
| | |
|---|---|
| H01L 27/08 | (2006.01) |
| H01L 27/108 | (2006.01) |
| H01L 27/11507 | (2017.01) |
| H01L 27/088 | (2006.01) |
| H01L 29/78 | (2006.01) |
| H01L 29/66 | (2006.01) |
| H01L 27/12 | (2006.01) |

(52) U.S. Cl.
CPC .... H01L 27/10826 (2013.01); H01L 27/0886 (2013.01); H01L 27/11507 (2013.01); H01L 27/1211 (2013.01); H01L 29/66795 (2013.01); H01L 29/7851 (2013.01)

(58) Field of Classification Search
CPC ............. H01L 27/10826; H01L 27/108; H01L 27/1052; H01L 27/1211; H01L 29/66795; H01L 27/0886; H01L 27/11507; H01L 29/7851; H01L 27/11502
See application file for complete search history.

(56) References Cited

U.S. PATENT DOCUMENTS

| | | | |
|---|---|---|---|
| 7,825,462 B2 * | 11/2010 | Tang ................. | H01L 27/10823 257/296 |
| 8,741,758 B2 | 6/2014 | Juengling | |
| 2005/0121709 A1 * | 6/2005 | Ozaki ................. | H01L 27/1159 257/295 |
| 2006/0046407 A1 * | 3/2006 | Juengling ......... | H01L 27/10823 438/301 |
| 2007/0267676 A1 * | 11/2007 | Kim .................. | H01L 29/66621 257/311 |
| 2009/0237996 A1 | 9/2009 | Kirsch et al. | |
| 2010/0237397 A1 * | 9/2010 | Uchiyama ......... | H01L 27/10876 257/306 |
| 2011/0103125 A1 * | 5/2011 | Tomishima ............ | G11C 8/005 365/72 |
| 2011/0193157 A1 | 8/2011 | Juengling | |
| 2011/0303974 A1 * | 12/2011 | Kim .................. | H01L 27/10876 257/329 |
| 2012/0056263 A1 * | 3/2012 | Lee ................... | H01L 21/76232 257/330 |

(Continued)

*Primary Examiner* — Michele Fan
(74) *Attorney, Agent, or Firm* — Wells St. John P.S.

(57) ABSTRACT

Some embodiments include a memory array which has rows of fins. Each fin has a first pedestal, a second pedestal and a trough between the first and second pedestals. A first source/drain region is within the first pedestal, a second source/drain region is within the second pedestal, and a channel region is along the trough between the first and second pedestals. Digit lines are electrically coupled with the first source/drain regions. Ferroelectric capacitors are electrically coupled with the second source/drain regions. Wordlines are along the rows of fins and overlap the channel regions. Conductive isolation lines are under the wordlines along the rows of fins.

18 Claims, 4 Drawing Sheets

(56) References Cited

U.S. PATENT DOCUMENTS

2013/0264621 A1* 10/2013 Nishi ................ H01L 27/10826
　　　　　　　　　　　　　　　　　　　　257/296
2014/0185355 A1   7/2014 Juengling
2016/0197084 A1*  7/2016 Yoon ................ H01L 27/10876
　　　　　　　　　　　　　　　　　　　　438/270

* cited by examiner

MEMORY ARRAYS COMPRISING FERROELECTRIC CAPACITORS

TECHNICAL FIELD

Memory arrays comprising ferroelectric capacitors.

BACKGROUND

Fin field effect transistors (finFETs) may be incorporated into integrated circuitry. Each finFET includes a fin (a tall thin semiconductor member) extending generally perpendicularly from a substrate. The fin comprises a pair of opposing sidewalls, and gate material is provided along at least one of the sidewalls. The gate material is spaced from the sidewall by gate dielectric material. A pair of source/drain regions is provided within the fin, and a channel region extends between the source/drain regions. In operation the gate is utilized to selectively control current flow within the channel region.

The finFETs may be utilized as access transistors in integrated memory arrays; such as, for example, dynamic random access memory (DRAM) arrays. In some applications the finFETs may be incorporated into crosshair memory cells. In such applications the source/drain regions are on a pair of upwardly-projecting pedestals, and the channel region is along a trough extending between the pedestals. A charge-storage device (for instance, a capacitor) is electrically coupled with one of the source/drain regions, and a digit line is electrically coupled with the other of the source/drain regions. The gate is beneath the source/drain regions, and extends along the trough comprising the channel region. Example finFET structures, and example crosshair memory cells, are described in U.S. Pat. No. 8,741,758, and U.S. patent publication numbers 2009/0237996 and 2011/0193157.

It is desired to develop improved finFET devices which are suitable for utilization in highly integrated applications, to develop improved architectures for incorporating finFET devices into highly integrated memory and/or other circuitry, and to develop improved methods for fabricating architectures comprising finFET devices.

DETAILED DESCRIPTION OF THE ILLUSTRATED EMBODIMENTS

Some embodiments pertain to new architectures suitable for utilization with ferroelectric memory. The ferroelectric memory may utilize a ferroelectric capacitor to store data. Specifically, a parallel orientation of a magnetic spin within the ferroelectric capacitor may correspond to a first data state, and an antiparallel orientation of the magnetic spin may correspond to a second data state; with one of the data states being designated as a memory bit "0" and the other being designated as a memory bit "1".

A problem with ferroelectric memory can be that the memory state of a particular cell may be undesirably influenced by electrical fluctuations (e.g., voltage changes) occurring in regions of a memory array proximate the cell, and ultimately data retained within the memory cell may be lost. In some circumstances the effects of minor influences may accumulate to eventually cause loss of the data stored within the cell. Accordingly, it is desired to develop arrangements which may protect the memory cells from being disturbed.

Figure 1:
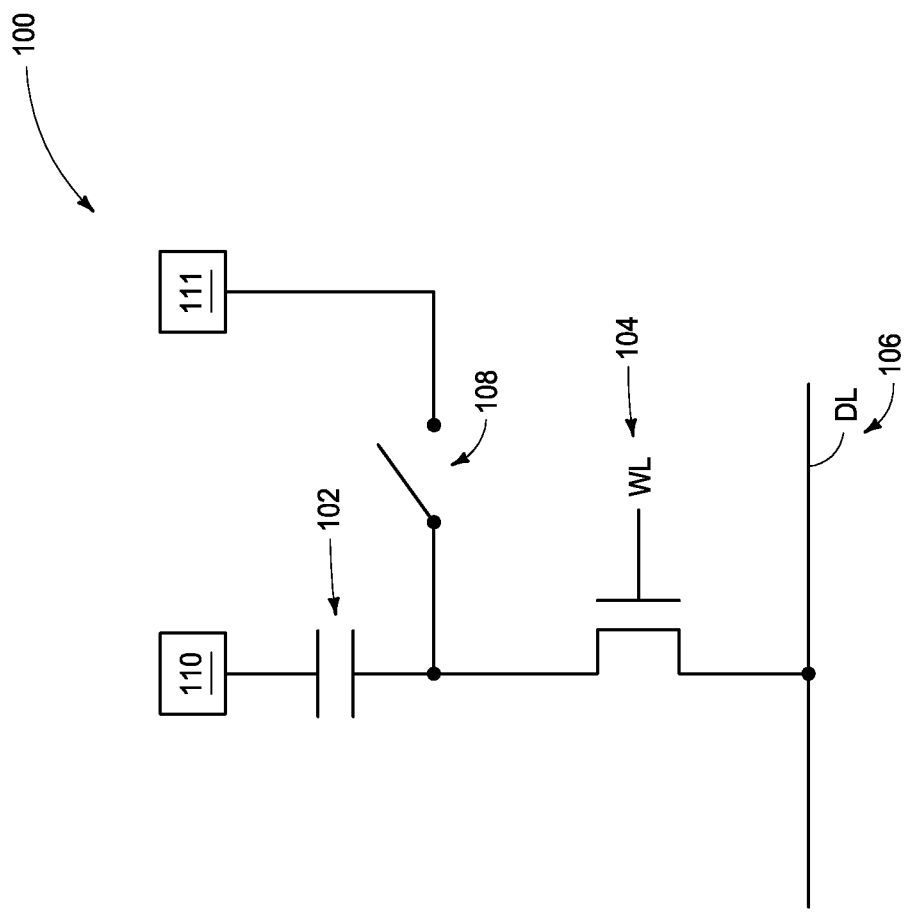
FIG. 1 is schematic diagram of an example arrangement of an access wordline, switch and ferroelectric capacitor.

FIG. 1 shows an arrangement 100 configured to protect a ferroelectric capacitor 102. The ferroelectric capacitor is accessed utilizing a wordline (WL) 104. Specifically, one of the source/drain regions of the wordline extends to a digit line (DL) and the other extends to the capacitor 102. A switch 108 is provided between the capacitor 102 and a voltage 111 (which may be similar to, or identical to, the voltage of a cell plate 110), and such switch may be used to short out the capacitor except for intervals during which the capacitor is to be accessed for programming or reading. In the illustrated architecture, the capacitor 102 has one plate coupled with a source/drain region of wordline 104, and another plate coupled to the cell plate 110.

The shorting of the capacitor via switch 108 may protect the capacitor from being electrically disturbed during operation of the memory array 100 (via, e.g., digit line fluctuations, cell plate fluctuations, etc.), which may preserve integrity of a data state of the capacitor.

Some embodiments include memory array architectures configured with suitable structures which may accomplish electrical isolation of ferroelectric capacitors in a manner analogous to that described above with reference to FIG. 1. Example memory array architectures are described with reference to FIGS. 2-4.

Figure 2:
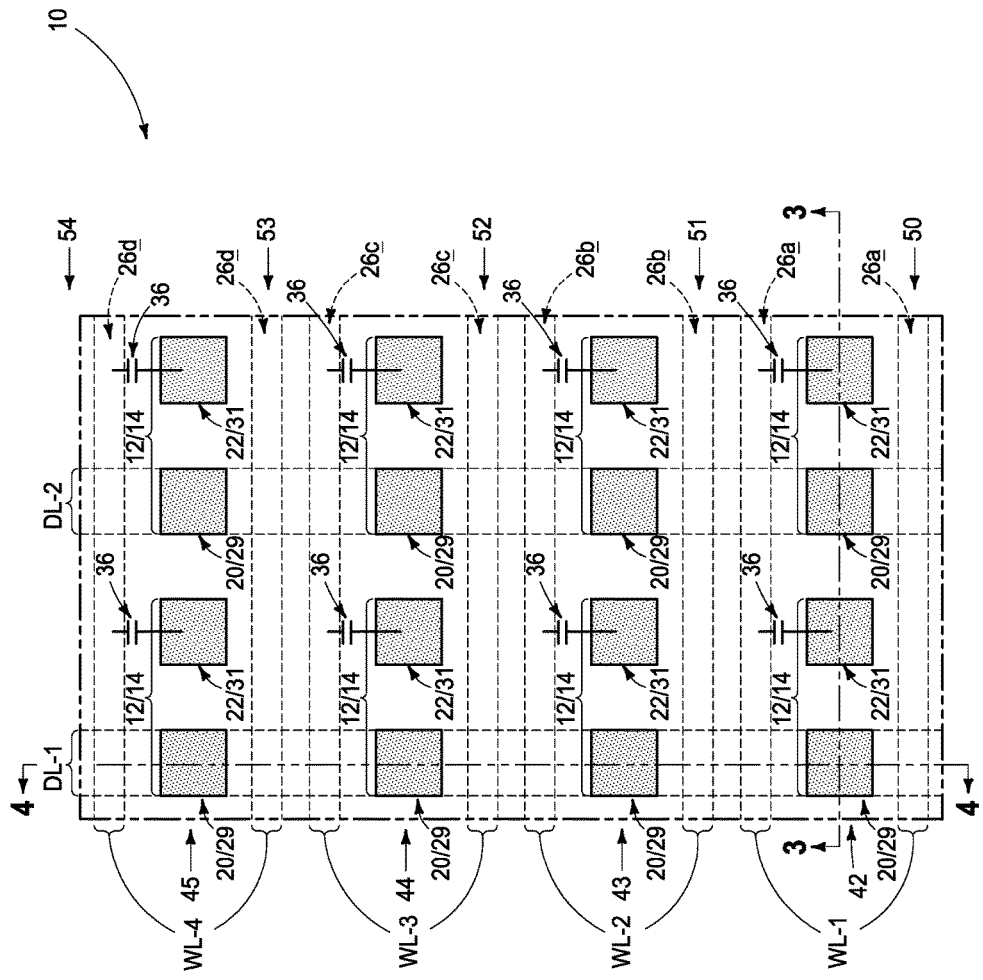
FIGS. 2-4 are a diagrammatic cross-sectional top view and diagrammatic cross-sectional side views of a region of an example memory array. The view of FIG. 3 is along the line 3-3 of FIG. 2; and the view of FIG. 4 is along the line 4-4 of FIG. 2.
Figure 3:
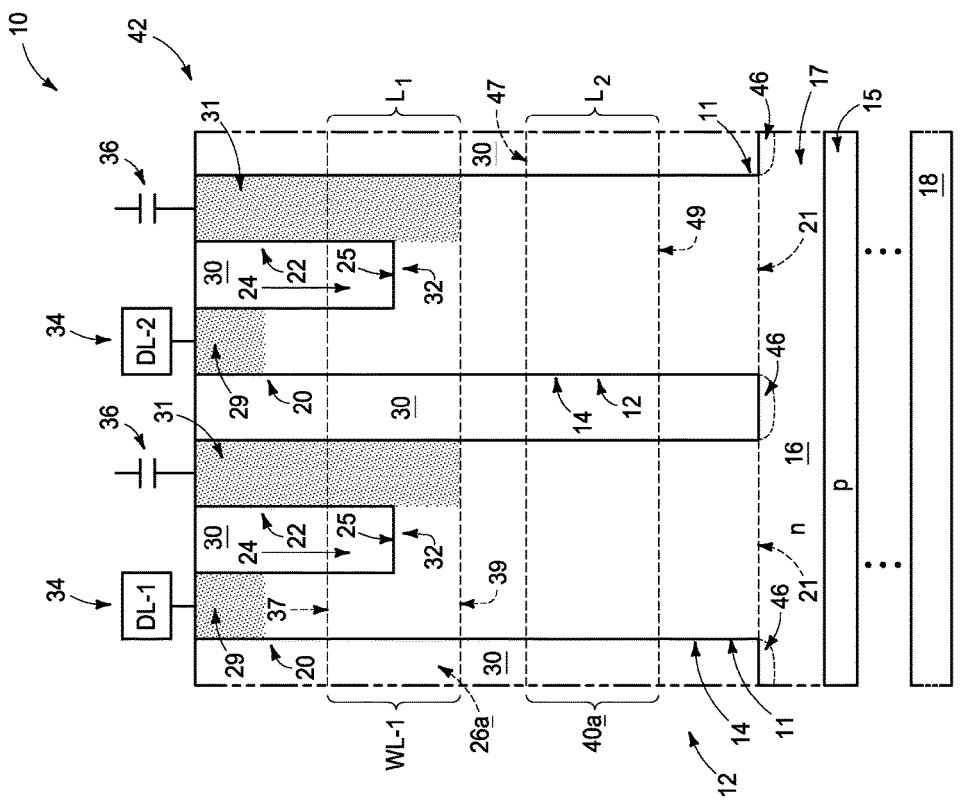
Figure 4:
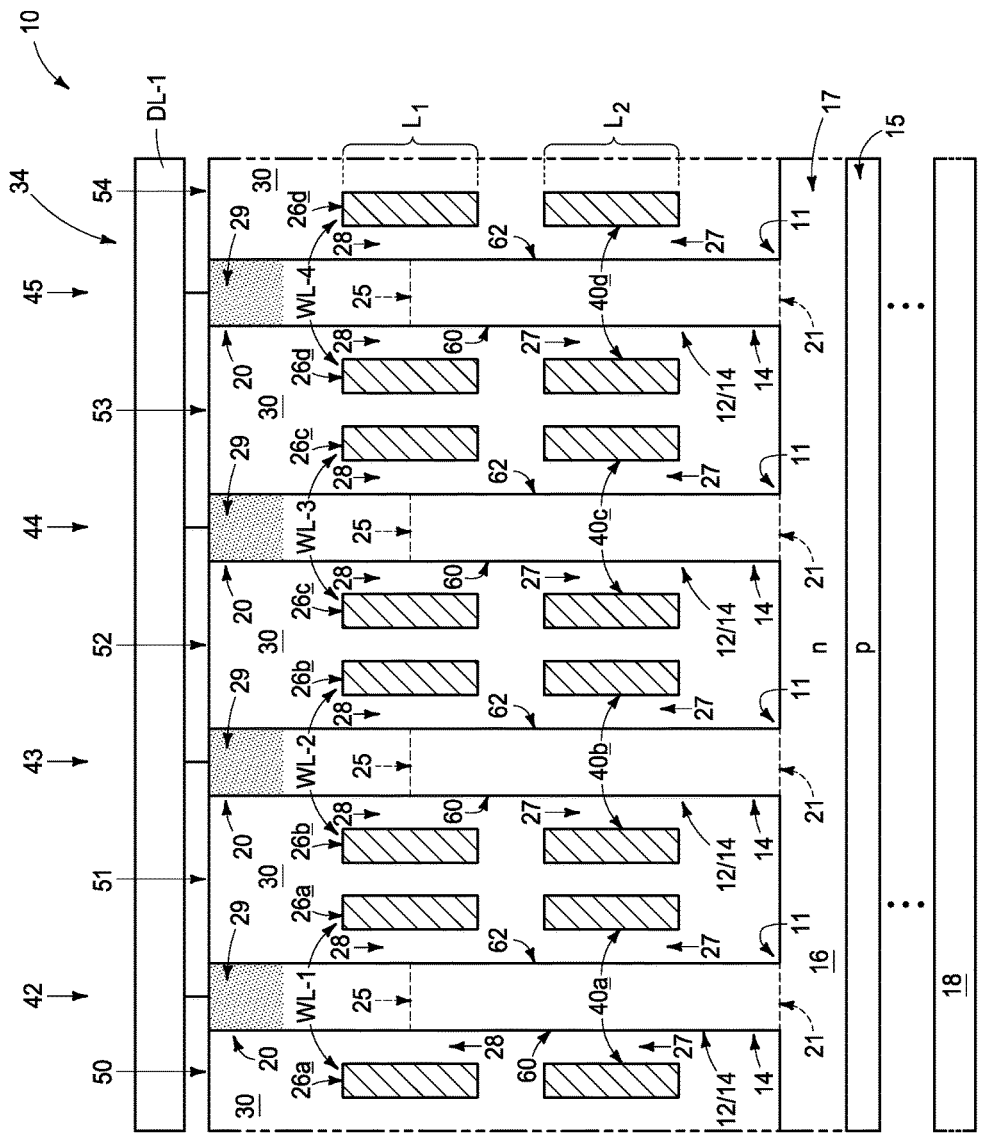

FIGS. 2-4 show a portion of an example memory array 10. The memory array includes a plurality of finFET transistors 12 arranged in rows and columns. Each finFET transistor includes a fin 14 of semiconductor material 16. The fins extend upwardly from an n-type doped region 17 of the semiconductor material 16, which is directly over a p-type doped region 15 of the semiconductor material 16. The p-type doped region 15 is supported by a substrate 18. The n-type doped region 17 may be referred to as an n-well. In other embodiments, the p-type doped region 15 may be replaced with an intrinsically-doped region, or with a lightly n-type doped region.

The substrate 18 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the substrate 18 may correspond to a semiconductor substrate containing one or more materials associated with integrated circuit fabrication. Such materials may include, for example, one or more of refractory metal materials, barrier materials, diffusion materials, insulator materials, etc. The substrate 18 is illustrated to be spaced from p-type doped region 15 to indicate that there may be circuitry, materials, levels, etc. (not shown) between the substrate and the p-type doped region 15 in some embodiments.

The semiconductor material 16 may comprise any suitable semiconductor material, and in some embodiments may comprise, consist essentially of, or consist of silicon.

The fins 14 have bases 11 along the n-type doped region 17, and an approximate boundary of the n-type doped region within such bases 17 is diagrammatically illustrated with dashed-lines 21. The n-type doped region 17 may be provided between the fins 14 and the p-type doped region 15 in order to avoid forming a diode along the bases 11 of the fins.

The n-type doped region 17 may have any suitable concentration of n-type dopant; including, for example, a concentration within a range of from greater than or equal to about $10^{17}$ atoms/cm$^3$ to less than or equal to about $10^{20}$ atoms/cm$^3$. The p-type doped region 15 may have any suitable concentration of p-type dopant; including, for example, a concentration of less than or equal to about $10^{17}$ atoms/cm$^3$. In some embodiments the p-type doped region 15 may be replaced with intrinsically-doped silicon or lightly n-type doped silicon. The lightly n-type doped silicon may have any suitable concentration of n-type dopant; including, for example, a concentration of less than or equal to about $10^{17}$ atoms/cm$^3$.

The fins 14 are shown to comprise a pair of upwardly-extending pedestals 20 and 22, and to have a trough (i.e., valley) 24 between the pedestals 20/22. The troughs 24 have upper surfaces 25. Such upper surfaces 25 are shown in dashed-line (i.e., phantom) view in FIG. 4 to indicate that they are out of the plane of the drawing (specifically, behind the plane of the cross-section of FIG. 4).

Regions of the pedestals 20/22 are illustrated to be heavily doped with n-type dopant (specifically, the doped regions are diagrammatically illustrated with stippling). The heavy doping may correspond to, for example, a dopant concentration in excess of $10^{20}$ atoms/cm$^3$. The heavily-doped regions within pedestals 20 correspond to first source/drain regions 29, and the heavily-doped regions within pedestals 22 correspond to second source/drain regions 31. In the shown embodiment the second source/drain regions 31 extend much deeper than the first source/drain regions 29.

Lower regions of fins 14 may be intrinsically doped, or may be doped to any other suitable level.

Wordlines (e.g., the wordlines WL-1, WL-2, WL-3 and WL-4) extend along sidewalls of the fins 14, and are spaced from such sidewalls by gate dielectric material 28. The wordlines (e.g., the wordlines WL-1, WL-2, WL-3 and WL-4) and gate dielectric material 28 are shown in FIG. 4. A region of wordline WL-1 is also diagrammatically illustrated in FIG. 3 in dashed-line (i.e., phantom) view since the wordline is out of the plane relative to the view of FIG. 3 (i.e., is in front of the plane). Wordlines WL-1, WL-2, WL-3 and WL-4 are also diagrammatically illustrated in FIG. 2 in dashed-line (i.e., phantom) view since the wordlines are below the plane of the FIG. 2 view.

The wordlines WL-1, WL-2, WL-3 and WL-4 may comprise any suitable electrically conductive materials, such as, for example, one or more of various metals (e.g., tungsten, titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The rows of memory array 10 (i.e., rows 42-45) are spaced from one another by gaps 50-54. The wordlines WL-1, WL-2, WL-3 and WL-4 are within such gaps 50-54, and comprise gates of the finFET transistors 12.

Each of the fins 14 has a pair of opposing sides 60 and 62 (as shown in FIG. 4). The sides 60 may be referred to as first sides of the fins 14, and the sides 62 may be referred to as second sides of the fins 14. The wordlines WL-1, WL-2, WL-3 and WL-4 comprise paired wordline components; with the respective wordline components being labeled 26a, 26b, 26c and 26d. The paired wordlines components 26a are on both sides 60/62 of the finFET row 42 and together correspond to the wordline WL-1, the paired wordline components 26b are on both sides 60/62 of the finFET row 43 and together correspond to the wordline WL-2, the paired wordline components 26c are on both sides 60/62 of the finFET row 44 and together correspond to the wordline WL-3, and the paired wordline components 26d are on both sides 60/62 of the finFET row 45 and together correspond to the wordline WL-4.

The paired wordline components 26a gate the finFET row 42 from both sides 60/62, and the paired wordlines 26b-c analogously gate each of the finFET rows 43-45 from both sides 60/62 of the respective rows. Each of the wordline components within a set (for instance each of the wordline components 26a within the set corresponding to WL-1) may be operated at a common voltage as one another, or may be operated at different voltages relative to one another.

The wordline components 26a-d may have any suitable width dimension along the cross-section of FIG. 4; including, for example, F/2, F/4, F/6, etc., where F is a minimum feature size of a lithographic process utilized during fabrication of the wordline components 26a-d.

The gate dielectric material 28 may comprise any suitable electrically insulative material, such as, for example, silicon dioxide. In the shown embodiment the gate dielectric material 28 merges with other dielectric material 30 that surrounds the fins 14. Such implies that the gate dielectric material 28 comprises a common composition as the other dielectric material 30. In other embodiments the gate dielectric material 28 may comprise a different composition than at least some of the remaining dielectric material 30. Further, although the dielectric material 30 is illustrated to be a single homogeneous composition, in other embodiments the dielectric material 30 may comprise two or more different compositions.

The transistors 12 may be each considered to comprise the pair of source/drain regions 29 and 31, and to comprise a channel region 32 (shown in FIG. 3) extending between the source/drain regions. Current flow along the channel regions is selectively activated by selectively energizing wordlines (i.e., is controlled by gates along the wordlines).

In some embodiments the source/drain regions 29/31 may each have upper surfaces with an area of approximately x by x (where x is a dimension). For instance, the upper surfaces of the source/drain regions 29/31 may be formed to a size of about F/2 by F/2 (where "F" is a minimum feature size of a lithographic method utilized during patterning of the source/drain regions). The upper surfaces of the source/drain regions 29/31 are shown to be square, but in other embodiments may be formed to any suitable shape, including, for example, circular, elliptical, rectangular, etc.

Digit lines 34 (e.g., the digit lines DL-1 and DL-2) are electrically coupled with first source/drain regions 29 of the finFET transistors 12 (the digit lines DL-1 and DL-2 are diagrammatically illustrated with boxes in the cross-sectional side views). The digit lines DL-1 and DL-2 may comprise any suitable electrically conductive composition or combination of compositions. In some embodiments the digit lines may comprise a metal-containing material (for instance, titanium, titanium silicide, titanium nitride, tungsten, tungsten silicide, tungsten nitride, platinum, cobalt, nickel, etc.) over conductively-doped semiconductor material (for instance, n-type doped silicon).

It may be advantageous for the digit lines to comprise metal-containing material (i.e., pure metal and/or metal-containing compositions) in that such may enable the digit lines to have low resistance.

Ferroelectric capacitors 36 are electrically coupled with the second source/drain regions 31 of the finFET transistors 12. The ferroelectric capacitors 36 are schematically illustrated, and may comprise any suitable configurations. For instance, the ferroelectric capacitors 36 may comprise ferroelectric insulative material between a pair of conductive electrodes. The electrodes may comprise any suitable electrode materials; and in some embodiments may comprise, consist essentially of, or consist of one or more materials selected from the group consisting of W, WN, TiN, TiCN, TiAlN, TiAlCN, Ti—W, Ru—TiN, TiOCN, RuO, RuTiON, TaN, TaAlN, TaON and TaOCN, etc., where the formulas indicate primary constituents rather than specific stoichiometries. The electrode materials may include elemental metals, alloys of two or more elemental metals, conductive metal compounds, and/or any other suitable materials. The ferroelectric insulative material may comprise any suitable composition or combination of compositions; and in some embodiments may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

The illustrated finFET transistors 12 are n-type devices in that they comprise n-type doped source/drain regions 29/31. In other embodiments doping may be reversed relative to the illustrated doping so that the transistors are p-type devices comprising p-type doped source/drain regions instead of n-type doped source/drain regions.

The wordline components 26a-d are over conductive isolation lines 40a-d. The conductive isolation lines 40a-d are shown in FIG. 4. A conductive isolation line 40a is also diagrammatically illustrated in FIG. 3 in dashed-line (i.e., phantom) view since the conductive isolation line 40a is out of the plane relative to the view of FIG. 3 (i.e., is in front of the plane). The embodiment of FIG. 4 has the conductive isolation lines 40a-d provided in paired sets along both sides 60/62 of the finFET rows 42-45. Specifically, the paired set of conductive isolation lines 40a provide conductive shielding along both sides 60/62 of finFET row 42, the paired set of conductive isolation lines 40b provide conductive shielding along both sides 60/62 of finFET row 43, the paired set of conductive isolation lines 40c provide conductive shielding along both sides 60/62 of finFET row 44, and the paired set of conductive isolation lines 40d provide conductive shielding along both sides 60/62 of finFET row 45.

The conductive isolation lines 40a-d may comprise any suitable electrically conductive materials, such as, for example, one or more of various metals (e.g., tungsten, titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). Accordingly, the conductive isolation lines 40a-d may comprise the same compositions as wordline components 26a-d, or may comprise different compositions than wordline components 26a-d.

In some embodiments the conductive isolation lines 40a-d consist of (or consist essentially of) conductively-doped semiconductor material (for instance, n-type doped silicon) and the wordline components 26a-d comprise metal. This may simplify fabrication in that conductively-doped silicon lines 40a-d may be formed in desired locations, oxide may be grown from upper surfaces of such lines, and then the metal-containing wordline components 26a-d may be deposited over such oxide. In contrast, if the conductive isolation lines 40a-d comprise metal it may be more difficult to form oxide (or other desired insulator) over upper surfaces of the conductive isolation lines 40a-d prior to forming the wordline components 26a-d. Also, it may be desired that the wordline components 26a-d comprise metal in order to have low resistance across the wordlines WL-1, WL-2, WL-3 and WL-4, as well as to have rapid response speed along the wordlines; whereas some methods of operation of the conductive isolation lines 40a-d may enable suitable performance even if the conductive isolation lines 40a-d are formed of conductively-doped semiconductor rather than metal.

The conductive isolation lines 40a-d are spaced from fins 14 by gate dielectric material 27. The gate dielectric material 27 may be identical in composition to the gate dielectric material 28 (i.e., the gate dielectric material between the wordline components 26a-d and the fins 14) in some embodiments, and may be a different composition than the gate dielectric material 28 in other embodiments. For instance, in some embodiments both gate dielectric material 28 and gate dielectric material 27 comprise, consist essentially of, or consist of silicon dioxide.

The memory array 10 may be considered to comprise a plurality of rows 42-45 of the fins 14, and associated finFETs 12. One of the wordlines (WL-1, WL-2, WL-3 or WL-4) and one of the underlying conductive isolation lines (40a, 40b, 40c or 40d) is associated with each of the individual rows. In operation, each of the conductive isolation lines (40a-d) may be effectively operated as the switch 108 of FIG. 1. Specifically, a conductive isolation line may be operated to provide shielding along a finFET row during a time that the row is not being accessed by a wordline (i.e. when the row is passive) and this may block carriers from migrating upwardly from the n-well 17, which protects the capacitors 36 along such row from being disturbed during operation of other regions of the array 10. The same conductive isolation line may be operated to be at low-voltage during a time that the row is accessed by the wordline for reading and/or writing operations (i.e., when the row is active). In some embodiments an individual wordline (WL-1, WL-2, WL-3 or WL-4) is operated at about 4 V when a row along the wordline is active, and is dropped to about 0 V when the row is not active; and the individual conductive isolation line (40a, 40b, 40c or 40d) along the row is maintained at about 4 V when the row is inactive, and then dropped to about 0 V when the row is active.

The wordline components 26a-d and the conductive isolation lines 40a-d have gate lengths $L_1$ and $L_2$, respectively. In some embodiments the gate lengths $L_1$ and $L_2$ may be about the same as one another, and in other embodiments the gate lengths $L_1$ and $L_2$ may be different relative to one another.

In the illustrated embodiment gettering regions 46 are provided along the rows 42-45 between adjacent fins 14 (as shown in FIG. 3 relative to row 42). The gettering regions may correspond to damage regions formed along an upper surface of the n-well 17. Such gettering regions may be utilized to trap minority carriers that could otherwise migrate within the semiconductor material 16 of fins 14 to possibly disturb memory states retained in the capacitors 36. Minority carriers may be generated by, for example, thermal energy, impact ionization, electric fields, gate induced drain leakage, etc. The gettering regions 46 may be formed with any suitable methodology, including, for example, implanting neutral dopants (i.e., carbon, silicon, germanium, etc.) into the upper surface of n-doped region 17 to form damage regions along such upper surface.

In the illustrated embodiment the first source/drain regions 29 are less deep than the second source/drain regions 31. Specifically, the first source/drain regions 29 are at upper regions of pedestals 20, and vertically spaced from the wordlines WL-1, WL-2, WL-3 and WL-4; and in contrast the second source/drain regions 31 extend from upper surfaces of the second pedestals 22 to beneath the surface 25 of trench 24. In the illustrated embodiment the second source/drain regions 31 extend vertically past an uppermost surface (i.e., upper side) 37 of the wordlines WL-1, WL-2, WL-3 and WL-4 (as shown in FIG. 3 relative to wordline WL-1), and extend vertically beneath a lowermost surface (i.e., lower side) 39 of the wordlines WL-1, WL-2, WL-3 and WL-4 (as shown in FIG. 3 relative to wordline WL-1). In other embodiments, the second source/drain regions 31 may extend vertically past the uppermost surfaces 37 of the wordlines WL-1, WL-2, WL-3 and WL-4, but not to beneath the lowermost surfaces 39 of the wordlines 26. In other embodiments both the first and second source/drain regions 29/31 may be entirely vertically above the wordlines WL-1, WL-2, WL-3 and WL-4. If a heavily-doped source/drain region (29 and possibly also 31) is entirely above a wordline, there may be a lightly-doped extension region between the heavily-doped source/drain region (29 and possibly also 31) and the underlying wordline. The lightly-doped extension region may be an implanted region and/or may form operationally during operation of the finFET devices 12.

The embodiment of FIG. 3 may be considered to show the second heavily-doped source/drain regions 31 (i.e., the source/drain regions electrically coupled with capacitors 36) extending entirely across the vertical dimensions of the wordlines (i.e., extending across the entire gate length $L_1$ of wordlines WL-1, WL-2, WL-3 and WL-4). Alternatively, the source/drain regions 31 may extend only partially across the vertical dimensions of the wordlines, or may be entirely above the wordlines. In yet other alternative embodiments, the source/drain regions 31 may extend entirely across the vertical dimensions of wordlines, and also partially across the vertical dimensions of conductive isolation lines 40a-d (i.e., partially across the gate length $L_2$ of conductive isolation lines 40a-d). In embodiments in which the source/drain regions 31 extend partially across the vertical dimensions of conductive isolation lines 40, such source/drain regions 31 may be considered to extend vertically downward beyond the uppermost surfaces of the conductive isolation lines 40a-d. In some embodiments the conductive isolation lines 40a-d may be considered to comprise uppermost surfaces (i.e., upper sides) 47 and lowermost surfaces (i.e., lower sides) 49, and the source/drain regions 31 may extend downwardly to beneath the uppermost surfaces 47 of the conductive isolation lines 40a-d. Generally, the source/drain regions 31 will not extend entirely across the vertical dimensions of conductive isolation lines 40a-d (i.e., will not extend to beneath the lowermost surfaces 49 of the conductive isolation lines 40a-d).

The structures and memory arrays described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, unless specifically stated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array which has rows of fins. Each fin has a first pedestal, a second pedestal and a trough between the first and second pedestals. A first source/drain region is within the first pedestal, a second source/drain region is within the second pedestal, and a channel region is along the trough between the first and second pedestals. Digit lines are electrically coupled with the first source/drain regions. Ferroelectric capacitors are electrically coupled with the second source/drain regions. Wordlines are along the rows of fins and overlap the channel regions. Conductive isolation lines are under the wordlines along the rows of fins.

Some embodiments include a memory array which has rows of fins. Each fin has a first pedestal, a second pedestal and a trough between the first and second pedestals. A first heavily-doped source/drain region is within the first pedestal, a second heavily-doped source/drain region is within the second pedestal, and a channel region is along the trough between the first and second pedestals. Digit lines are electrically coupled with the first source/drain regions. Ferroelectric capacitors are electrically coupled with the second source/drain regions. Metal-containing wordlines are along the rows of fins and overlap the channel regions. The second heavily-doped source/drain regions vertically overlap the metal-containing wordlines, and the first heavily-doped source/drain regions do not vertically overlap the metal-containing wordlines. Conductive isolation lines are under the wordlines along the rows of fins. The conductive isolation lines consist of conductively-doped semiconductor material.

Some embodiments include a memory array which has rows of fins. Each fin has a first pedestal, a second pedestal and a trough between the first and second pedestals. A first source/drain region is within the first pedestal, a second source/drain region is within the second pedestal, and a channel region is along the trough between the first and second pedestals. The fins extend upwardly from an n-type doped semiconductor material. Gettering regions are along segments of the n-type doped semiconductor material between the fins. Digit lines are electrically coupled with the first source/drain regions. Ferroelectric capacitors are electrically coupled with the second source/drain regions. Wordlines are along the rows of fins and overlap the channel regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory array, comprising:
    rows of fins; each fin having a first pedestal, a second pedestal and a trough between the first and second pedestals; a first source/drain region being within the first pedestal, a second source/drain region being within the second pedestal, and a channel region being along the trough between the first and second pedestals;
    digit lines electrically coupled with the first source/drain regions;
    ferroelectric capacitors electrically coupled with the second source/drain regions;
    wordlines along the rows of fins and overlapping the channel regions; and
    conductive isolation lines under the wordlines along the rows of fins.

2. The memory array of claim 1 wherein each row of fins has a first side and a second side; the wordlines gating each row from both of the first and second sides.

3. The memory array of claim 2 wherein each of the wordlines comprise a pair of wordline components, with one component of said pair extending along the first side of a row of fins and the other component of said pair extending along the second side of the row of fins; and wherein the wordline components comprise metal.

4. The memory array of claim 1 wherein the wordlines and conductive isolation lines comprise a same composition as one another.

5. The memory array of claim 1 wherein the wordlines and conductive isolation lines comprise different compositions relative to one another.

6. The memory array of claim 5 wherein the wordlines comprise metal and the conductive isolation lines consist of conductively-doped silicon.

7. The memory array of claim 1 wherein the second source/drain regions are heavily-doped regions that extend vertically across the wordlines.

8. The memory array of claim 1 wherein the second source/drain regions are heavily-doped regions that extend vertically across the wordlines, and that extend vertically downward beyond uppermost surfaces of the conductive isolation lines.

9. The memory array of claim 1 wherein the fins have bases along n-type doped semiconductor material, and comprising damage regions formed along an upper surface of the n-type doped semiconductor material between bases of adjacent fins along the rows of fins.

10. The memory array of claim 9 wherein the n-type doped semiconductor material is above and directly against p-type doped semiconductor material.

11. A memory array, comprising:
    rows of fins; each fin having a first pedestal, a second pedestal and a trough between the first and second pedestals; a first heavily-doped source/drain region being within the first pedestal, a second heavily-doped source/drain region being within the second pedestal, and a channel region being along the trough between the first and second pedestals;
    digit lines electrically coupled with the first source/drain regions;
    ferroelectric capacitors electrically coupled with the second source/drain regions;
    metal-containing wordlines along the rows of fins and overlapping the channel regions; the second heavily-doped source/drain regions vertically overlapping the metal-containing wordlines, and the first heavily-doped source/drain regions not vertically overlapping the metal-containing wordlines; and
    conductive isolation lines under the wordlines along the rows of fins, the conductive isolation lines consisting of conductively-doped semiconductor material.

12. The memory array of claim 11 wherein each row of fins has a first side and a second side; the metal-containing wordlines gating each row from both of the first and second sides.

13. The memory array of claim 12 wherein each of the wordlines comprise a pair of wordline components, with one component of said pair extending along the first side of a row of fins and the other component of said pair extending along the second side of the row of fins; and wherein the wordline components of said pair are a same composition as one another.

14. The memory array of claim 11 wherein the second heavily-doped source/drain regions extend vertically across the metal-containing wordlines.

15. A memory array, comprising:
    rows of fins; each fin having a first pedestal, a second pedestal and a trough between the first and second pedestals; a first source/drain region being within the first pedestal, a second source/drain region being within the second pedestal, and a channel region being along the trough between the first and second pedestals; the fins extending upwardly from an n-type doped semiconductor material; gettering regions being along segments of the n-type doped semiconductor material between the fins;
    digit lines electrically coupled with the first source/drain regions;
    ferroelectric capacitors electrically coupled with the second source/drain regions; and wordlines along the rows of fins and overlapping the channel regions.

16. The memory array of claim 15 wherein each row of fins has a first side and a second side; the wordlines gating each row from both of the first and second sides.

17. The memory array of claim 15 comprising silicon-containing conductive isolation lines under the wordlines along the rows of fins.

18. The memory array of claim 17 wherein each row of fins has a first side and a second side; the silicon-containing conductive isolation lines shielding each row from both of the first and second sides.

* * * * *